United States Patent
Arz

[19]

[11] Patent Number: 5,901,036
[45] Date of Patent: May 4, 1999

[54] COOLING DEVICE FOR ELECTRICAL ASSEMBLIES

[75] Inventor: Winfried Arz, Burgthann, Germany

[73] Assignee: Siemens Aktiengesellschaft, Munich, Germany

[21] Appl. No.: 08/817,737

[22] PCT Filed: Oct. 18, 1995

[86] PCT No.: PCT/DE95/01455

§ 371 Date: Apr. 24, 1997

§ 102(e) Date: Apr. 24, 1997

[87] PCT Pub. No.: WO96/13142

PCT Pub. Date: May 2, 1996

[30] Foreign Application Priority Data

Oct. 24, 1994 [DE] Germany ............... 44 37 971

[51] Int. Cl.[6] ................................................. H05H 7/20
[52] U.S. Cl. ................... 361/699; 165/80.4; 257/714
[58] Field of Search .................. 165/80.4; 257/714; 361/688–689, 698–699, 702, 704, 707, 711

[56] References Cited

U.S. PATENT DOCUMENTS

| 4,155,402 | 5/1979 | Just . |
| 4,495,378 | 1/1985 | Dötzer et al. . |
| 4,682,269 | 7/1987 | Pitasi . |
| 4,689,719 | 8/1987 | Prussas et al. . |
| 4,884,168 | 11/1989 | August et al. ........................ 361/699 |
| 5,331,510 | 7/1994 | Ouchi et al. . |

FOREIGN PATENT DOCUMENTS

| E-70.707 | 7/1959 | France . |
| OS 14 39 308 | 12/1968 | Germany . |
| 32 02 271 | 7/1983 | Germany . |
| 33 29 325 | 3/1984 | Germany . |
| 33 15 414 | 10/1984 | Germany . |
| 36 05 554 | 8/1987 | Germany . |
| U 88 04 742 | 7/1988 | Germany . |
| 43 22 665 | 1/1994 | Germany . |
| 2 165 704 | 4/1986 | United Kingdom . |

*Primary Examiner*—Gregory Thompson
*Attorney, Agent, or Firm*—Hill & Simpson

[57] ABSTRACT

A cooling device is provided which is firmly connectable to a carrier. The cooling device includes cooling channels for guiding a coolant stream and which have at least one flat side for a highly thermally conductive connection to at least one electrical assembly. The cooling device may be mounted such that the electrical assembly can be releasably pressed against the flat side of the cooling device.

11 Claims, 4 Drawing Sheets

COOLING DEVICE FOR ELECTRICAL ASSEMBLIES

BACKGROUND OF THE INVENTION

The present invention is directed to a cooling device for electrical assemblies for mounting on a carrier.

The development of more and more powerful electronic assemblies also makes high demands of the cooling technology. A number of concerns are thereby raised in addition to the optimum heat elimination:

(1) The structure should be modular and flexible, i.e. assemblies other than those originally provided should be capable of being mounted. Given the increase in dissipated power, which derives, for example, due to higher performance data, the cooling unit should be adaptable to the new demands without involved modifications. Modifications of a mechanical nature (for example, housing dimensions, fastening capability) should also be taken into consideration.

(2) Manipulation in assembly and disassembly should be simple, for example when replacing assemblies during the course of a repair.

(3) An electrical insulation between the assemblies and the cooling system should be possible with simple means.

(4) Problems with the electrochemical compatibility of the material through which flow is conducted should be avoided.

(5) Finally, the cooling system should be low cost.

Conventional liquid coolers satisfy these demands relatively inadequately in practice. An integration of cooling channels in the assemblies themselves is standard. This, however, is involved and problematical in the assembly or, respectively, disassembly of the assemblies. The cooling water connections must be parted in the disassembly of the assemblies, whereby, in particular, care must be exercised to see that cooling water does not come into contact with voltage-carrying parts. Particular precautions must there for be taken. Such precautions, however, are time consuming and expensive and serve to complicate manipulation. This problem can only be inadequately solved with quick-acting closures for the water management since such quick-acting closures have considerable disadvantages in terms of dead space volume, tightness, pressure loss and costs.

German Published Application 1 439 308 discloses a cooling arrangement wherein a transistor is screwed onto a cooling member that is mounted on a carrier. Cooling channels through which air flows proceed through the cooling member. A printed circuit board is provided on that side of the transistor lying opposite the cooling member.

DE 35 31 729 C2 discloses a cooling device wherein electronic components are arranged on a ceramic plate. For heat elimination, the side of the ceramic plate facing away from the equipment side is provided with pins by which heat is output to the ambient air that flows past. Since the ceramic plate distributes heat well, the temperature difference between the various pins is slight and the heat elimination into the air is efficient.

BRIEF SUMMARY OF THE INVENTION

An object of the present invention is to fashion a cooling device such that the replacement of assemblies is simplified and wherein the components are held at a largely uniform temperature level.

To this end, a cooling device for electrical assemblies is provided for securely mounting on a carrier. The cooling device includes cooling channels for guidance of a coolant stream which, in turn, include at least one flat side for a good thermally conductive connection to at least one electrical assembly. Such connection ensures that the assembly embraces a base plate having both good heat storing capability and thermal conductivity. On such base plate are a plurality of heatemitting components which are arranged in a highly thermally conductive fashion whereby the electrical assembly can be releasably pressed against the flat side of the cooling device.

Additional features and advantages of the present invention are described in, and will be apparent from, the detailed description of the invention and from the drawing.

DETAILED DESCRIPTION OF THE INVENTION

Figure 1:
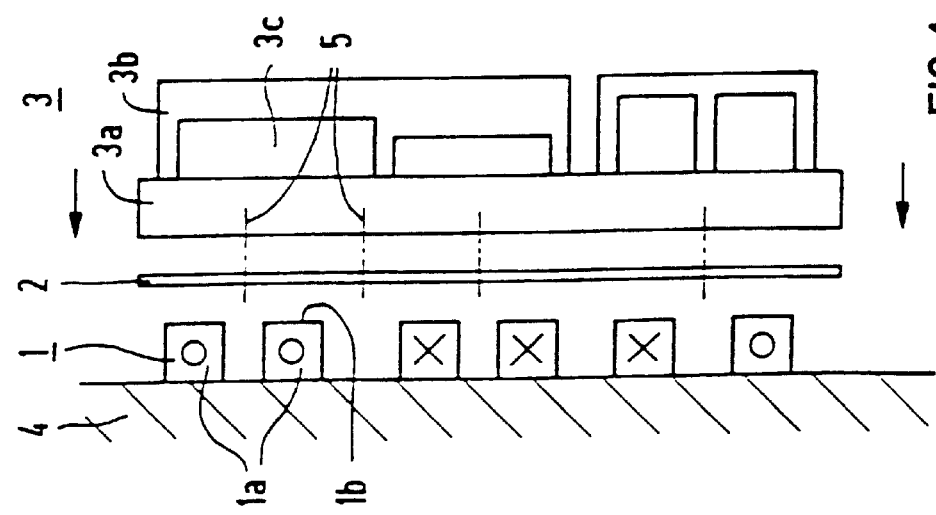
FIG. 1 illustrates a sectional view of the cooling device with rectangular tubes.

Reference character 4 in FIG. 1 indicates a carrier that, for example, can be an installation wall or a cabinet wall. Cooling channels 1a in the form of rectangular tubes are mounted on this carrier 4. Upon interposition of a foil 2, an electrical assembly 3 to be cooled is pressed onto the cooling channels 1a. This occurs via screw connections 5 that are shown as dot-dash lines in FIG. 1 and as crosses in the plan view in FIG. 2.

The assembly 3 to be cooled comprises a base plate 3a in the form of a block with high heat accumulation capability. Components 3b, 3c to be cooled are connected to this base plate 3a in a highly heat-conducting fashion. The thermal energy output by the components 3b is quickly absorbed in this base plate 3a and is then transmitted to the cooling device 1. This is especially expedient when heat quantities that cannot be eliminated fast enough periodically occur in the components 3b. These heat quantities are briefly assumed by the base plate 3a and then output to the coding device 1. Advantageously, the plate 3a is composed of an adequately thick aluminum plate onto which the components 3b, 3c are screwed with the assistance of heat-conducting paste.

As a result of the good thermal conductivity of the base plate 3a, potential temperature differences between the components 3b, 3c are also compensated. This is of particular significance in many applications since temperature differences influence the electrical data of the components 3b, 3c.

At its back side, the base plate 3a is clamped to the flat sides 1b of cooling channels 1a. The indicated screw connections 5 are tightened with defined torque for that purpose.

The cooling channels 1a are advantageously fabricated of copper rectangular tubing. They are designed such that they are soft enough to compensate for rough surface tolerances, for example, waviness. For compensating fine surface tolerances, for example, roughness, a ductile heat-conducting foil 2 is also placed between the base plate 3a and the cooling channels 1a according to FIGS. 1 and 2. This foil 2 can be composed, for example, of tin, lead or indium.

The cooling channels 1a are expediently attached according to the energy density in the assembly 3. The cooling channels 1a preferably lie in the region of the heat-emitting components 3b, 3c. Given a high thermal load, the cooling channels 1a lie directly under the heat sources in the component that, for example, can be an IGBT module, a transistor or a diode. Stated more generally, the density of the cooling channels 1a varies depending on the topically different evolution of heat of the assemblies 3. The main heat stream thus proceeds into the coolant over the shortest path.

Figure 2:
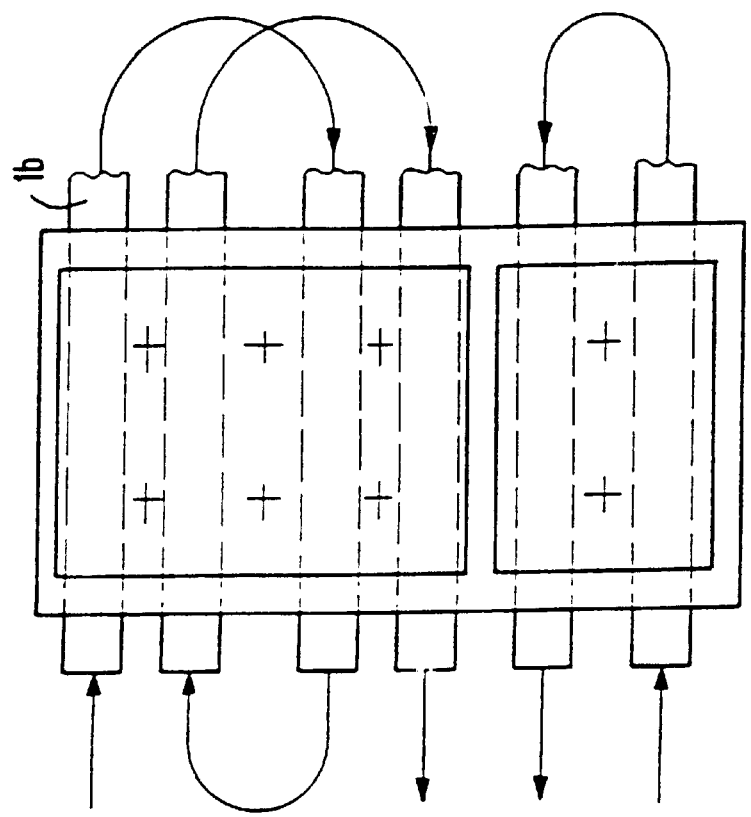
FIG. 2 illustrates the cooling device of FIG. 1 in plan view.

Water flows through the cooling channels 1a such that an optimally uniform temperature distribution derives over the assembly 3. As can be seen in FIG. 2, for example, the coolant flows into the first cooling channel 1a and, with respectively changing direction, is subsequently discharged via the third, the second and the fourth cooling channel 1a. Further, a coolant feed is provided for the sixth channel, whereby the coolant flows back via the fifth channel.

What is thus achieved is that cooling channels receive "fresh" coolant and coolant that has already been heated in alternation, so that a relatively uniform temperature profile is established, taking the temperature compensation established by the block 3a into consideration.

The illustrated arrangement is especially suited for modular systems. As a result, different assemblies can be unproblematically utilized even in light of changing customer desires or a change in product. Problem-free installation and removal of the assemblies 3 is therefore possible.

Up until now, the mounting or, unmounting of cooled electrical assemblies was always problematical since the coolant circulation had to be thereby parted. Given the solution disclosed herein, however, the cooling channels 1a remain firmly connected to the carrier 4, and the entire cooling water circulation remains inviolate given that the installation and removal of the assemblies 3 occurs without any leakage of water. The replacement time for an assembly becomes short since the screw connections 5 merely have to be unscrewed or, respectively, retightened with a predetermined torque. The illustrated cooling device can also be advantageously employed when the electrical components 3b, 3c lie at high operating voltage potential. For insulation, for example, the cooling channels 1a can be provided with an insulation coat 1b. Alternatively, thermally conductive and electrically insulating foil can be inserted into the space between the block 3a and the cooling channels 1a.

In cooling devices, careful attention must be paid to the electrochemical conditions. Substantial deficiencies can occur due to the flow of current and corrosion given unfavorable material pairings. In the present arrangement, the cooling channels 1a are advantageously fabricated of copper or nonferrous heavy metal. Due to the better handling, the low weight, and for reasons of economic feasibility, the base plate 3a should be produced from an aluminum alloy. By contrast to cooling systems wherein water flows directly through the individual assemblies, the material pairing in the separated arrangement described herein can be nearly freely selected.

The disclosed cooling device can also be produced with little outlay. The critical parts thereof (cooling channels 1a) are composed of half-finished goods that are processed in metal-removing fashion to only a slight degree.

Figure 4:
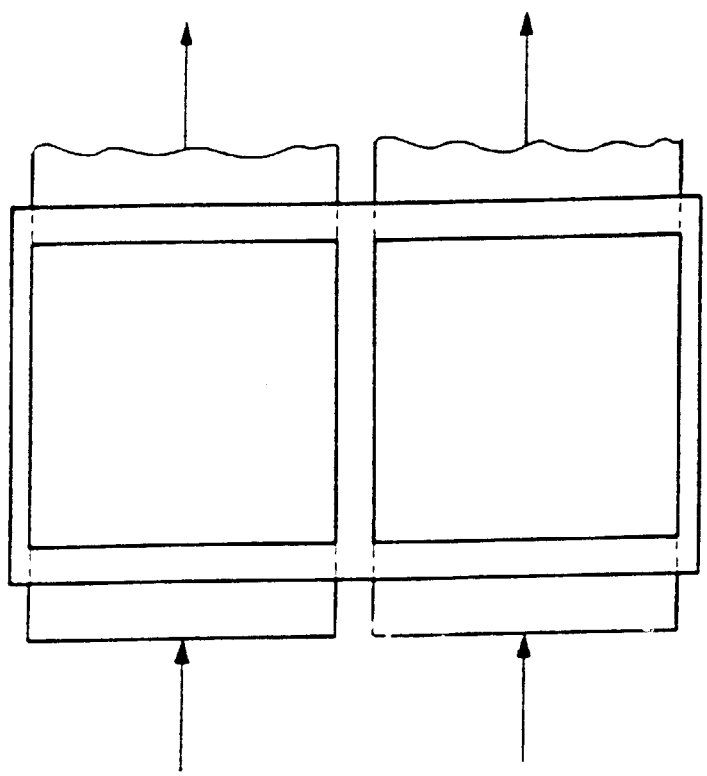
FIG. 4 illustrates the cooling device of FIG. 3 in plan view.
Figure 3:
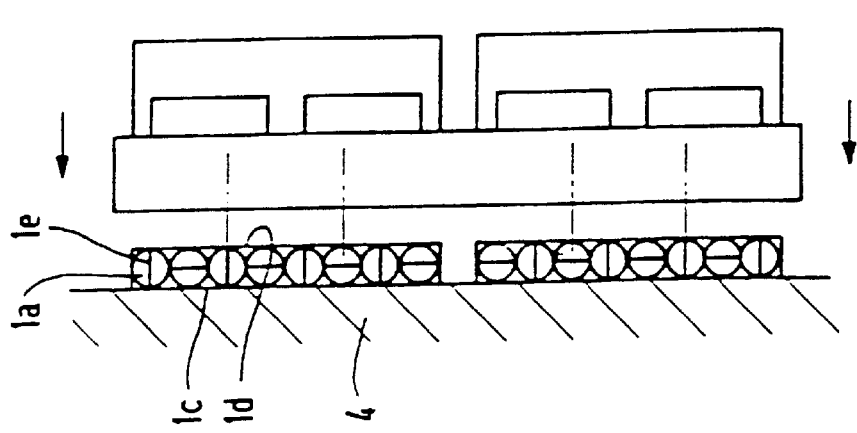
FIG. 3 illustrates the cooling device with plates.

FIGS. 3 and 4 show another exemplary embodiment of the invention. Only two very broad cooling channels 1a, defined between parallel plates 1c and 1b, are provided, so that only two coolant admissions and discharges are present, as can be seen in the plan view of FIG. 4. Turbulence elements 1e that see to a better heat transmission between coolant and cooling channel are provided in the cooling channels.

Figure 6:
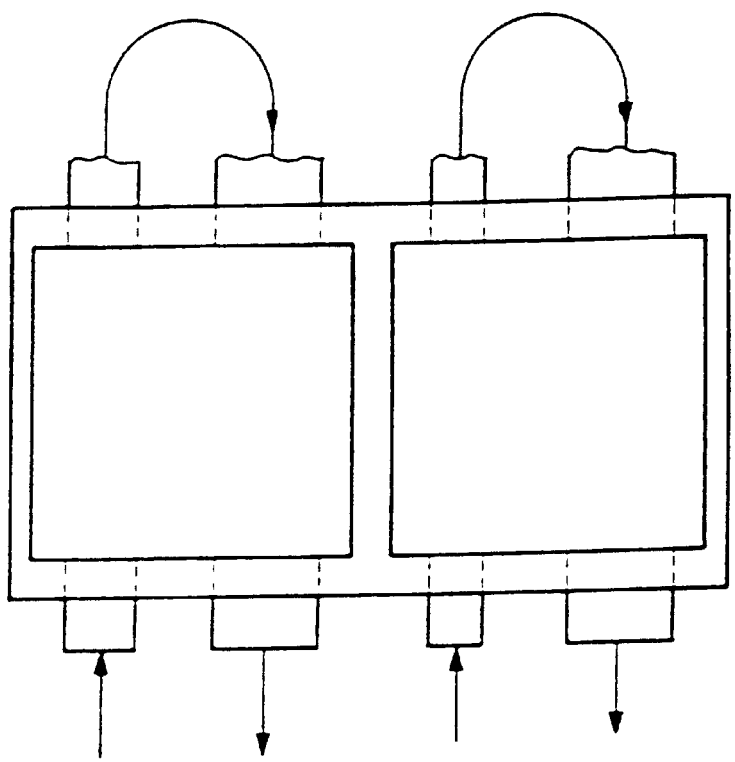
FIG. 6 illustrates the cooling device of FIG. 5 in plan view.
Figure 5:
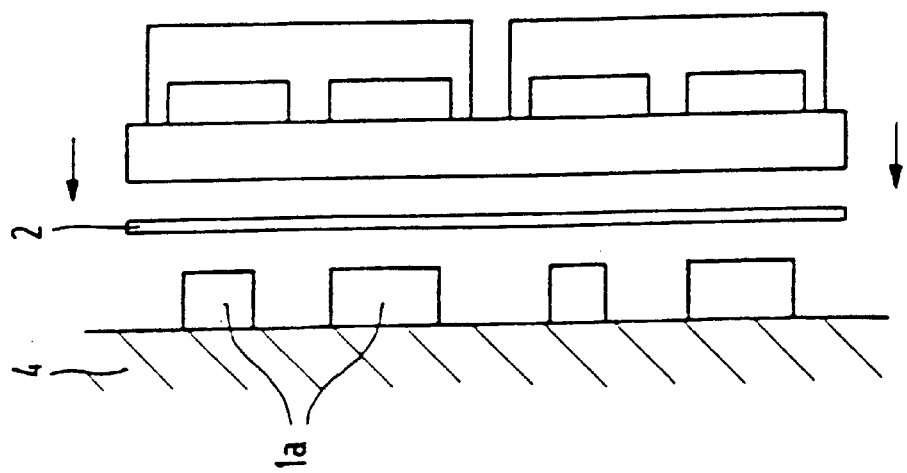
FIG. 5 illustrates a sectional view of the cooling device with varying crossection.

In the exemplary embodiment according to FIGS. 5 and 6, the width of the cooling channels 1a varies according to the heat emission of the neighboring electrical components, so that the heat elimination can be matched to the requirements.

A maximum heat elimination given minimum pressure loss, i.e. optimization of the flow and heat transmission conditions, is achieved with the measures according to FIGS. 3 through 6.

Figure 8:
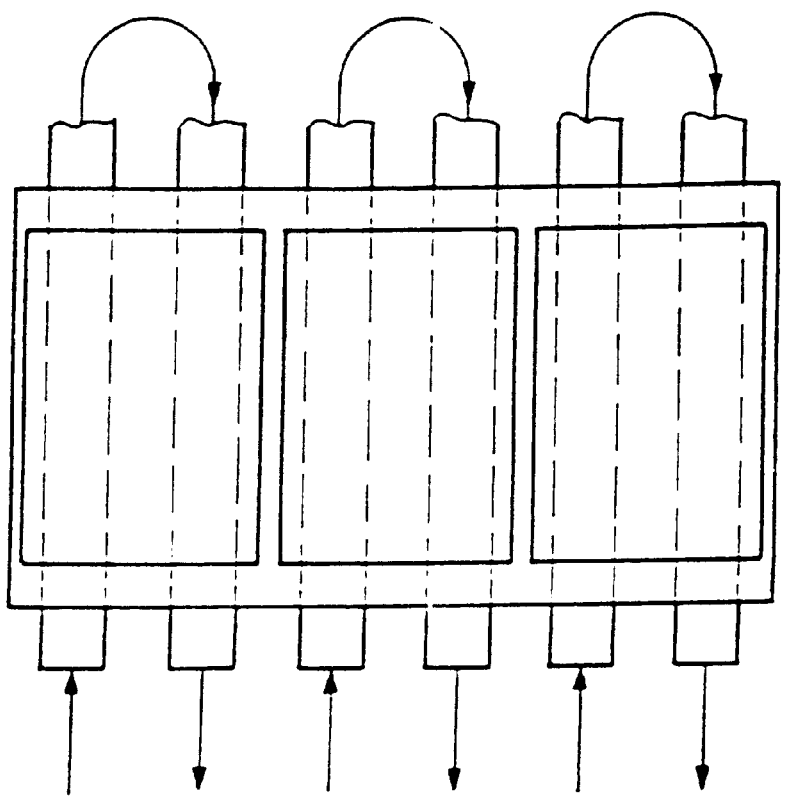
FIG. 8 illustrates the cooling device of FIG. 7 in plan view.
Figure 7:
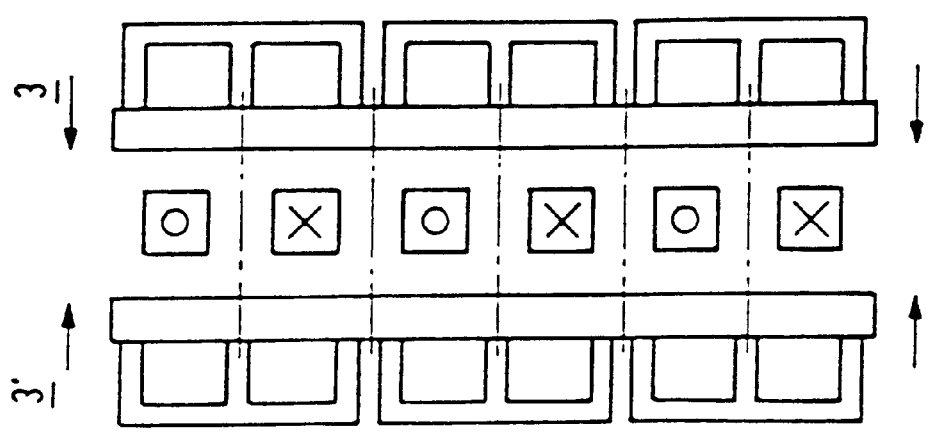
FIG. 7 illustrates a sectional view of a cooling device wherein assemblies are mounted from both sides.

In the exemplary embodiment of FIGS. 7 and 8, finally, assemblies 3 are provided at both sides of the cooling channels 1a, so that the cooling device can be used for a greater number of assemblies.

Furthermore, it should be understood that other various changes and modifications to the presently preferred embodiments described herein will be apparent to those skilled in the art. Such changes and modifications may be made without departing from the spirit and scope of the present invention and without diminishing its intended advantages. Therefore, it is intended that such changes and modifications be covered by the hereinafter appended claims.

I claim as my invention:

1. A cooling device for at least one electrical assembly, comprising:

a base plate having good heat storing capability and thermal conductivity and on which a plurality of heat-emitting components of said at least one electrical assembly are secured in a highly-thermally conductive fashion;

a carrier;

a plurality of cooling channels mounted on said carrier for guidance of a coolant stream, at least one flat surface of the cooling device being associated with the plurality of cooling channels for good thermally-conductive connection to the base plate; and means for mounting the cooling device wherein said at least one flat surface is releasably pressed against said base plate.

2. The cooling device according to claim 1, wherein said at least one flat surface is easily deformable.

3. The cooling device according to claim 1, further comprising a highly thermally-conductive and easily deformable foil, said foil being interpositioned between said base plate and said at least one flat surface.

4. The cooling device according to claim 1, further comprising an electrically-insulated and highly thermally-conductive foil, said foil being interpositioned between said base plate and said at least one flat surface.

5. The cooling device according to claim 1, further comprising a plurality of rectangular tubes wherein each of said plurality of cooling channels is formed within a single rectangular tube, each of said plurality of rectangular tubes being of rectangular cross-section and arranged parallel to one another and having at least one planar outside surface for thermal contact to said base plate.

6. The cooling device according to claim 1, wherein said at least one flat surface is coated in electrically insulating fashion.

7. The cooling device according to claim 1, wherein each of said plurality of cooling channels includes turbulence elements.

8. The cooling device according to claim 1, wherein a cross-section of each of said plurality of cooling channels varies dependent on a topically different evolution of heat of said at least one electrical assembly.

9. The cooling device according to claim 1, wherein a density of each of said plurality of cooling channels varies dependent on a topically different evolution of heat of said at least one electrical assembly.

10. The cooling device according to claim 1, wherein a flow of coolant in one of said plurality of cooling channels is in a direction opposite to a second flow of coolant in an adjacent one of said plurality of cooling channels.

11. The cooling device according to claim 1, further comprising a plurality of coolant stream feed points for said plurality of cooling channels, said feed points being uniformly distributed to obtain an optimally uniform temperature distribution over said cooling device.

* * * * *